(12) United States Patent
Whitman et al.

(10) Patent No.: US 11,143,042 B2
(45) Date of Patent: Oct. 12, 2021

(54) SYSTEM AND METHOD FOR APPLYING A METALLIC COATING

(71) Applicant: UNITED TECHNOLOGIES CORPORATION, Farmington, CT (US)

(72) Inventors: Giovanni Whitman, Berlin, CT (US); Henry H. Thayer, Wethersfield, CT (US); Gary J. Larson, Madison, CT (US); Wangen Lin, South Glastonbury, CT (US); Donn Blankenship, Southbury, CT (US)

(73) Assignee: RAYTHEON TECHNOLOGIES CORPORATION, Farmington, CT (US)

( * ) Notice: Subject to any disclaimer, the term of this patent is extended or adjusted under 35 U.S.C. 154(b) by 1262 days.

(21) Appl. No.: 15/117,626

(22) PCT Filed: Feb. 11, 2015

(86) PCT No.: PCT/US2015/015374
§ 371 (c)(1),
(2) Date: Aug. 9, 2016

(87) PCT Pub. No.: WO2015/123268
PCT Pub. Date: Aug. 20, 2015

(65) Prior Publication Data
US 2016/0348519 A1 Dec. 1, 2016

Related U.S. Application Data

(60) Provisional application No. 61/938,418, filed on Feb. 11, 2014.

(51) Int. Cl.
*F01D 9/04* (2006.01)
*C23C 4/08* (2016.01)
(Continued)

(52) U.S. Cl.
CPC ................ *F01D 9/041* (2013.01); *C23C 4/02* (2013.01); *C23C 4/08* (2013.01); *C23C 4/134* (2016.01);
(Continued)

(58) Field of Classification Search
CPC ...... F01D 9/041; F01D 5/288; F05D 2220/32; F05D 2230/312; F05D 2230/313;
(Continued)

(56) References Cited

U.S. PATENT DOCUMENTS 6,296,447 B1 * 10/2001 Rigney ..................... C23C 4/00
416/241 R
6,963,044 B2 * 11/2005 Fusaro, Jr. ............... B23K 9/04
219/121.46

(Continued)

OTHER PUBLICATIONS

U.S. Department of Defense, Electrospark Deposition for Depot- and Field-Level Component Repair and Replacement of Hard Chromium Plating, Feb. 2008, pp. 7-8 (Year: 2008).*

(Continued)

*Primary Examiner* — Aaron R Eastman
(74) *Attorney, Agent, or Firm* — Cantor Colburn LLP

(57) ABSTRACT

The present disclosure relates generally to a system and method for applying a metallic coating. A first metallic coating may be applied to a portion of a total surface of a part and a second metallic coating may be applied to substantially the total surface. The metallic coating may be applied to a vane cluster for use in a turbomachine.

20 Claims, 4 Drawing Sheets

(51) Int. Cl.
 *C23C 4/02* (2006.01)
 *F01D 5/28* (2006.01)
 *C23C 4/134* (2016.01)
 *C23C 14/22* (2006.01)

(52) U.S. Cl.
 CPC ............ *C23C 14/221* (2013.01); *F01D 5/288* (2013.01); *F05D 2220/32* (2013.01); *F05D 2230/312* (2013.01); *F05D 2230/313* (2013.01); *F05D 2300/10* (2013.01); *Y02T 50/60* (2013.01)

(58) Field of Classification Search
 CPC ....... F05D 2300/10; C23C 4/134; C23C 4/02; C23C 4/08; C23C 14/221
 USPC ..................................................... 416/241 R
 See application file for complete search history.

(56) References Cited

U.S. PATENT DOCUMENTS

| | | | | |
|---|---|---|---|---|
| 7,723,636 | B2* | 5/2010 | Ochiai | ..................... B23H 1/00 219/69.17 |
| 8,343,589 | B2* | 1/2013 | Kirby | ..................... C04B 41/009 204/192.1 |
| 2001/0012568 | A1 | 8/2001 | Bose | |
| 2006/0029733 | A1* | 2/2006 | Bhatia | ................... C04B 41/009 427/248.1 |
| 2009/0053068 | A1 | 2/2009 | Hardwicke | |
| 2009/0274562 | A1 | 11/2009 | Minor | |
| 2011/0116912 | A1* | 5/2011 | McCall | ................. C23C 14/042 415/177 |
| 2011/0244138 | A1* | 10/2011 | Schlichting | ............... C23C 4/06 427/448 |
| 2014/0120308 | A1* | 5/2014 | Lin | ..................... C23C 28/3215 428/137 |
| 2015/0322563 | A1* | 11/2015 | Snyder | .................. C23C 14/042 427/448 |
| 2016/0167180 | A1* | 6/2016 | Thayer | .................... B23P 6/007 219/76.13 |
| 2017/0016454 | A1* | 1/2017 | Strock | .................... B23K 9/044 |

OTHER PUBLICATIONS

International Search Report for International Application No. PCT/US2015/015374 dated May 19, 2015.

Written Opinion for International Application No. PCT/US2015/015374 dated May 19, 2015.

\* cited by examiner

SYSTEM AND METHOD FOR APPLYING A METALLIC COATING

CROSS REFERENCE TO RELATED APPLICATION

This application is a National Phase Application of Patent Application PCT/US2015/015374 filed on Feb. 11, 2015, which claims the benefit of U.S. Ser. No. 61/938,418, filed Feb. 11, 2014. The entire contents of each of these applications are incorporated herein by reference thereto.

TECHNICAL FIELD OF THE DISCLOSURE

The present disclosure is generally related to the manufacture and restoration of aerospace components, such as components of gas turbine engines and, more specifically, to a system and method for application of metallic coatings.

BACKGROUND OF THE DISCLOSURE

Gas turbine engines operate by burning a combustible fuel-air mixture, and converting the energy of combustion into a propulsive force. A gas turbine engine typically includes an inlet, a compressor, a combustor, a turbine, and an exhaust duct, where the compressor draws in ambient air and increases its temperature and pressure. Fuel is added to the compressed air in the combustor, where it is burned to raise the gas temperature, thereby imparting energy to the gas stream. The resulting combustion gases are directed axially rearward from the combustor through an annular duct, where the gases interact with multiple turbine stages disposed within the annular duct.

Each turbine stage includes a stationary turbine nozzle derived of multiple stator vanes, and a downstream row of rotatable blades. The stator vanes direct the combustion gases axially rearward in a downstream direction, and the rotatable blades direct the energy of the combustion gases to an axial drive shaft that is interconnected with the compressor. Stator vanes typically have airfoil geometries designated by concave pressure sides and convex suction sides that extend axially between corresponding leading and trailing edges of the airfoils. Each airfoil is also typically disposed circumferentially between an outer arcuate shroud and an inner arcuate platform, thereby forming a nozzle segment. Multiple nozzle segments are interconnected to form the annular ring of the stationary turbine nozzle. Each nozzle segment may be cast to include one or more stator vanes disposed between the same outer arcuate shroud and inner arcuate platform. For example, a nozzle segment containing a single stator vane is typically referred to as a nozzle singlet, a nozzle segment containing two stator vanes is typically referred to as a nozzle doublet, nozzle segment containing three stator vanes is typically referred to as a nozzle triplet, and so on. For ease of description herein, the term "vane cluster" is intended to encompass any nozzle segment having two or more stator vanes. Vane clustering may have several advantages. The reduced engine part count may ease manufacturing and reduce weight. The reduction in the number of platform and shroud gaps (e.g., a halving with nozzle doublets) may have performance advantages. First, intergap leakage may correspondingly be reduced. Second, diversion of cooling air to cool gap seals may also be reduced.

The components of the turbine stages (e.g., vanes and blades) are required to be able to withstand the thermal and oxidation conditions of the high temperature combustion gas during the course of operation. To protect turbine engine components from the extreme conditions, such components are typically coated with metallic bond coats that provide oxidation and/or corrosion resistance, and with ceramic thermal barrier coatings to provide thermal protection. With vane clusters, each airfoil may interfere with the application of the coating to the adjacent airfoil(s), where the vane cluster geometry provides a mask which affects coating distribution on the "hidden" faces of the airfoils that are not positioned on either end of the vane cluster, thereby reducing the amount of coating which is applied to those areas. Such non-uniformity is further exacerbated by the absence of interference to the application of coating on the surfaces at each end of the vane cluster. This is true even when so-called non-line of sight coating application methods, such as electron beam physical vapor deposition (EB-PVD), are used. The hidden areas therefore may not receive adequate coating thickness due to the exposed areas on either end of the vane cluster reaching the coating thickness limit, thereby creating non-uniformity of coating profiles from vane to vane. The varying coating distribution between the two airfoils creates a situation of mismatched thermal gradients and thermal growth.

SUMMARY OF THE DISCLOSURE

In one embodiment, a method for application of a metallic coating to a vane cluster including at least two cluster vanes is disclosed, the method comprising: applying a first layer of metallic coating within a portion of a total surface of the at least two cluster vanes; and applying a second layer of metallic coating to substantially the total surface of the at least two cluster vanes.

In a further embodiment of the above, the metallic coating comprises a metallic bond coat.

In a further embodiment of any of the above, the portion comprises a non-line of sight area of the total surface.

In a further embodiment of any of the above, the applying a first layer step comprises applying the first layer of metallic coating within the portion of the total surface of the at least two cluster vanes using a contact metal deposition process.

In a further embodiment of any of the above, the contact metal deposition process comprises an electro-spark deposition process.

In a further embodiment of any of the above, the electro-spark deposition process utilizes an electrode and comprises: applying a first voltage to the electrode; applying a second voltage to at least one of the at least two cluster vanes, wherein the first voltage is greater than the second voltage; and touching the electrode to the portion of the total surface of the at least two cluster vanes.

In a further embodiment of any of the above, the second voltage comprises ground.

In a further embodiment of any of the above, further comprising rotating the electrode while touching the electrode to the portion of the total surface of the at least two cluster vanes.

In a further embodiment of any of the above, further comprising supplying a shielding gas to an area where the electrode touches portion of the total surface of the at least two cluster vanes.

In a further embodiment of any of the above, the step of touching the electrode to the portion of the total surface of the at least two cluster vanes is performed until a predetermined thickness of the first layer of metallic coating is deposited.

In a further embodiment of any of the above, the step of applying the second layer of metallic coating is performed using a process selected from the group consisting of: low pressure plasma spray, electron beam physical vapor deposition, air spray, and electron beam directed vapor deposition.

In a further embodiment of any of the above, the first layer is disposed beneath the second layer.

In another embodiment, a vane cluster is disclosed comprising: a cluster platform; a cluster shroud; at least two cluster vanes extending between the cluster platform and the cluster shroud and defining a total surface; a first layer of metallic coating disposed within a portion of the total surface of the at least two cluster vanes; and a second layer of metallic coating disposed on substantially the total surface of the at least two cluster vanes.

In a further embodiment of the above, the metallic coating comprises a metallic bond coat.

In a further embodiment of any of the above, the first layer of metallic coating is applied within the portion of the total surface of the at least two cluster vanes using an electro-spark deposition process.

In a further embodiment of any of the above, the first layer is disposed beneath the second layer.

In a further embodiment of any of the above, a vane cluster including at least two cluster vanes and comprising a metallic coating is formed according to any of the above methods.

Other embodiments are also disclosed.

BRIEF DESCRIPTION OF THE DRAWINGS

The embodiments and other features, advantages and disclosures contained herein, and the manner of attaining them, will become apparent and the present disclosure will be better understood by reference to the following description of various exemplary embodiments of the present disclosure taken in conjunction with the accompanying drawings, wherein.

DETAILED DESCRIPTION OF THE DISCLOSED EMBODIMENTS

For the purposes of promoting an understanding of the principles of the invention, reference will now be made to certain embodiments and specific language will be used to describe the same. It will nevertheless be understood that no limitation of the scope of the invention is thereby intended, and alterations and modifications in the illustrated device, and further applications of the principles of the invention as illustrated therein are herein contemplated as would normally occur to one skilled in the art to which the invention relates.

Figure 1:
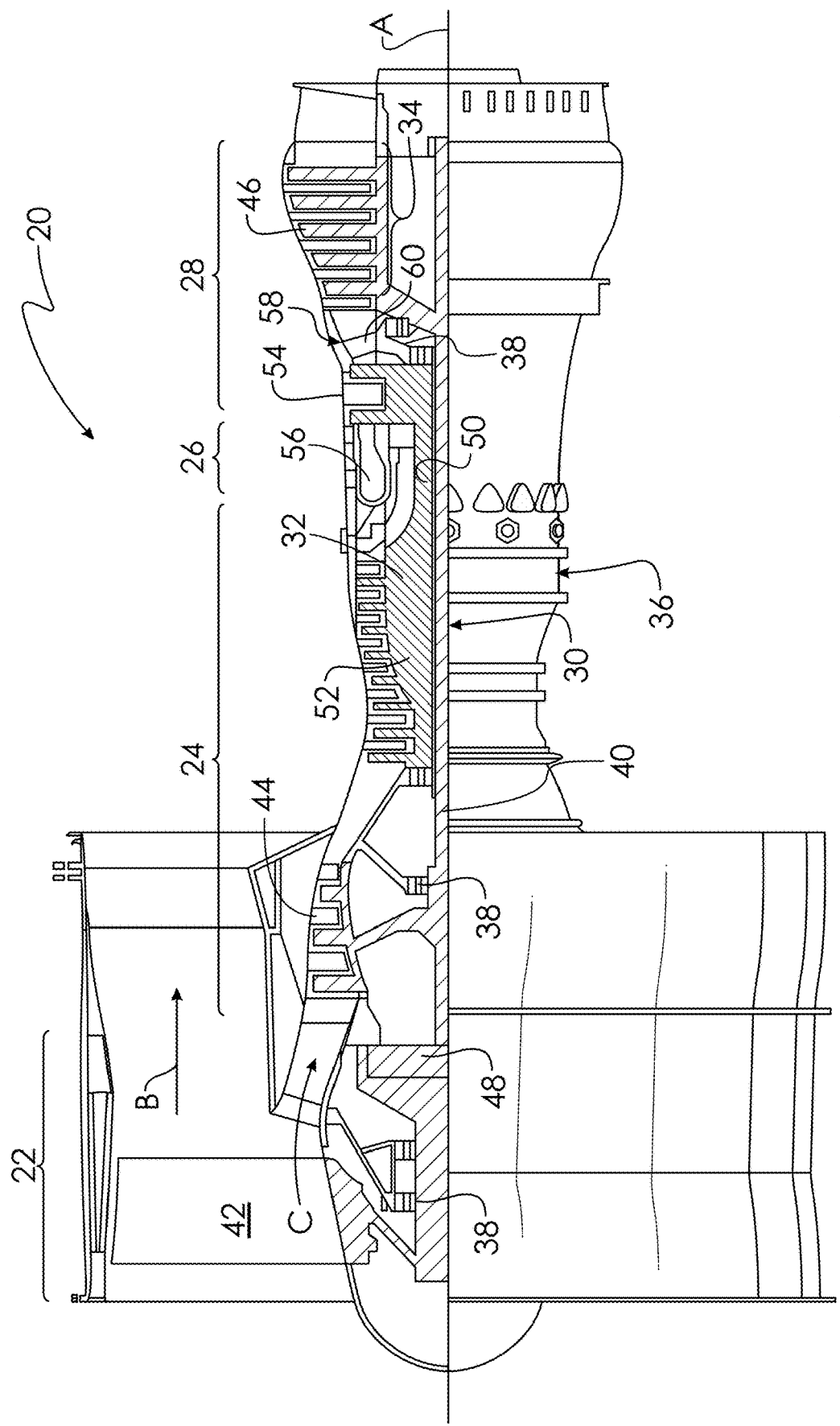
FIG. 1 is a schematic partial cross-sectional view of a gas turbine engine in an embodiment.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flow path B in a bypass duct, while the compressor section 24 drives air along a core flow path C for compression and communication into the combustor section 26 then expansion through the turbine section 28. Although depicted as a two-spool turbofan gas turbine engine in the disclosed non-limiting embodiment, it should be understood that the concepts described herein are not limited to use with two-spool turbofans as the teachings may be applied to other types of turbine engines including three-spool architectures.

The exemplary engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided, and the location of bearing systems 38 may be varied as appropriate to the application.

The low speed spool 30 generally includes an inner shaft 40 that interconnects a fan 42, a low pressure compressor 44 and a low pressure turbine 46. The inner shaft 40 is connected to the fan 42 through a speed change mechanism, which in exemplary gas turbine engine 20 is illustrated as a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged in exemplary gas turbine 20 between the high pressure compressor 52 and the high pressure turbine 54. An engine static structure 36 is arranged generally between the high pressure turbine 54 and the low pressure turbine 46. The engine static structure 36 further supports bearing systems 38 in the turbine section 28. The inner shaft 40 and the outer shaft 50 are concentric and rotate via bearing systems 38 about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. In one disclosed embodiment, the engine 20 bypass ratio is greater than about ten (10:1), the fan diameter is significantly larger than that of the low pressure compressor 44, and the low pressure turbine 46 has a pressure ratio that is greater than about five 5:1. Low pressure turbine 46 pressure ratio is pressure measured prior to inlet of low pressure turbine 46 as related to the pressure at the outlet of the low pressure turbine 46 prior to an exhaust nozzle. The geared architecture 48 may be an epicycle gear train, such as a planetary gear system or other gear system, with a gear reduction ratio of greater than about 2.3:1. It should be understood, however, that the above parameters are only exemplary of one embodiment of a geared architecture engine and that the present invention is applicable to other gas turbine engines including direct drive turbofans.

A significant amount of thrust is provided by the bypass flow B due to the high bypass ratio. The fan section 22 of the engine 20 is designed for a particular flight condition—typically cruise at about 0.8 Mach and about 35,000 feet (10,688 meters). The flight condition of 0.8 Mach and 35,000 ft, (10,688 meters) with the engine at its best fuel consumption—also known as "bucket cruise Thrust Specific Fuel Consumption ('TSFC')"—is the industry standard parameter of lbm of fuel being burned divided by lbf of thrust the engine produces at that minimum point. "Low fan pressure ratio" is the pressure ratio across the fan blade alone, without a Fan Exit Guide Vane ("FEGV") system. The low fan pressure ratio as disclosed herein according to one non-limiting embodiment is less than about 1.45. "Low corrected fan tip speed" is the actual fan tip speed in ft/sec divided by an industry standard temperature correction of $[(Tram\ °R)/(518.7°\ R)]^{0.5}$. The "Low corrected fan tip speed" as disclosed herein according to one non-limiting embodiment is less than about 1150 ft/second (350.5 m/sec).

Figure 2:
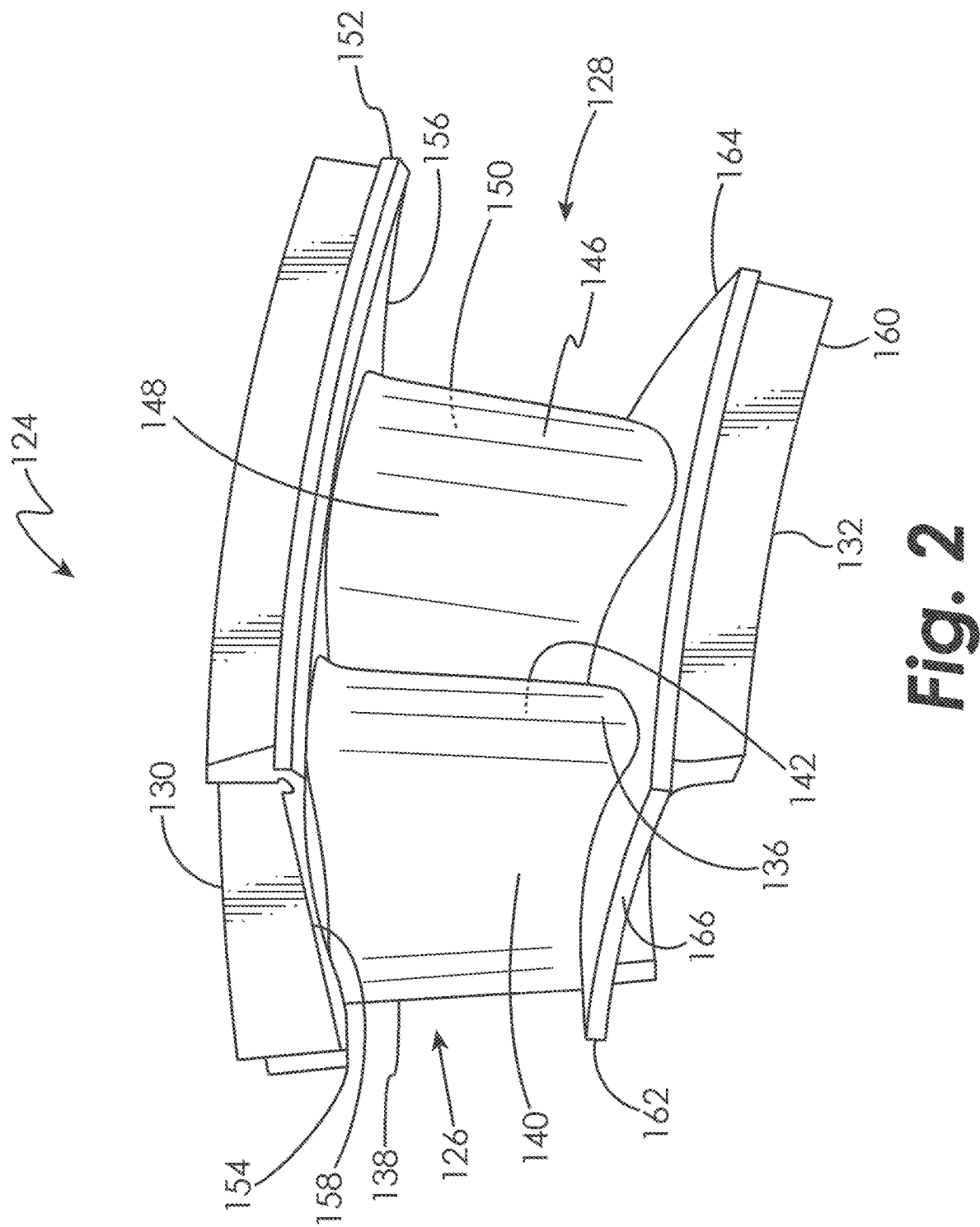
FIG. 2 is a schematic perspective view of a vane cluster in an embodiment.

FIG. 2 schematically illustrates multiple stator vanes of a vane cluster 124. As shown in FIG. 2, vane cluster 124 is illustrated as a nozzle doublet, but vane cluster 124 may have any plural number of stator vanes. The vane cluster 124 may be formed from any desired material, such as titanium, titanium alloy, ceramic matrix composite or monolithic ceramic, to name just a few non-limiting examples. Vane cluster 124 includes vanes 126 and 128, cluster shroud 130, and cluster platform 132. Vanes 126 and 128 may be turbine-stage stator vanes secured between cluster shroud 130 and cluster platform 132 in an embodiment. In other embodiments, the vanes 126 and 128 may be used in other types of turbomachinery. Vane 126 includes leading edge 136, trailing edge 138, pressure sidewall 140, and suction sidewall 142. Pressure sidewall 140 is the concave pressure side of vane 126, which extends between leading edge 136 and trailing edge 138. Correspondingly, suction sidewall 142 is the convex suction side of vane 126, which also extends between leading edge 136 and trailing edge 138, and is the opposing surface to pressure sidewall 140.

Similarly, vane 128 includes trailing edge 144 (see FIGS. 3 and 4), leading edge 146, pressure sidewall 148, and suction sidewall 150. Pressure sidewall 148 is the concave pressure side of vane 128, which extends between leading edge 146 and the corresponding trailing edge 144. Correspondingly, suction sidewall 150 is the convex suction side of vane 128, which also extends between leading edge 146 and the corresponding trailing edge 144, and is the opposing surface to pressure sidewall 146.

Cluster shroud 130 is an outer arcuate band defining a cluster shroud radius and is secured to vanes 126 and 128. Cluster shroud 130 includes leading edge 152, trailing edge 154, pressure side edge 156, and suction side edge 158, where leading edge 152 and trailing edge 154 are the upstream and downstream edges of shroud 130, respectively. Pressure side edge 156 and suction side edge 158 are the lateral edges of cluster shroud 130, and are the edges that are secured to outer shrouds of adjacent nozzle segments (not shown) with leaf seal engagements, for example, to form a stationary turbine nozzle.

Correspondingly, cluster platform 132 is an inner arcuate band defining a cluster platform radius and is secured to vanes 126 and 128, opposite of cluster shroud 130. Cluster platform 132 includes leading edge 160, trailing edge 162, pressure side edge 164, and suction side edge 166, where leading edge 160 and trailing edge 162 are the upstream and downstream edges of cluster platform 132, respectively. Pressure side edge 164 and suction side edge 166 are the lateral edges of cluster platform 132, and are the edges that are secured to inner platforms of adjacent nozzle segments (not shown) with leaf seal engagements, for example, to form the stationary turbine nozzle.

Figure 3:
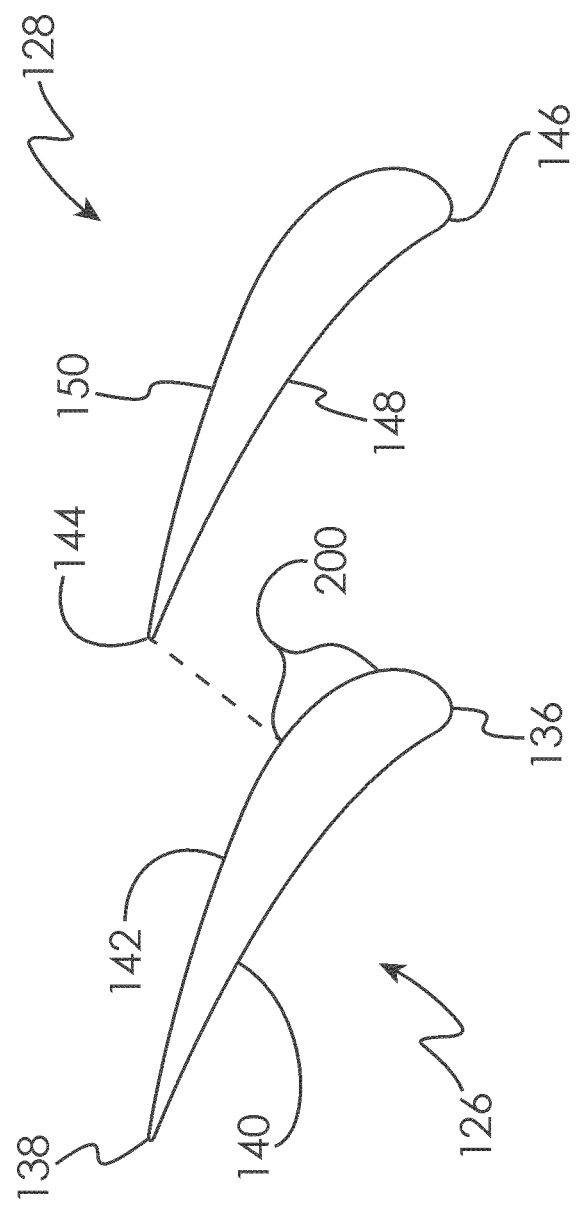
FIG. 3 is a schematic cross-sectional view of a vane cluster in an embodiment.

Referring now to FIG. 3 with continuing reference to FIG. 2, suction sidewall 142 of vane 126 and pressure sidewall 148 of vane 128 are outboard surfaces that are directly accessible with many coating techniques. As a result, coatings may be readily deposited on suction sidewall 142 and pressure sidewall 148 with substantially uniform thicknesses. In contrast, however, pressure sidewall 140 of vane 126 and suction sidewall 150 of vane 128 are inboard surfaces, which partially shadow each other. The partial shadowing prevents many coating techniques from evenly depositing coatings on pressure sidewall 140 and suction sidewall 150, thereby reducing coating thickness uniformity across the surfaces of the vanes 126 and 128. For example, the area 200 on suction sidewall 150 may receive reduced coating thickness as compared to other surfaces of the vane 128, to name just one non-limiting example. This is true even when using non-line of sight coating techniques. An analogous reduction in coating thickness uniformity will result for vane clusters having more than two vanes. The reduction in coating thickness uniformity correspondingly reduces the effectiveness of the formed coatings in providing corrosion, oxidation, and/or thermal resistance during the course of operation in a gas turbine engine.

Figure 4:
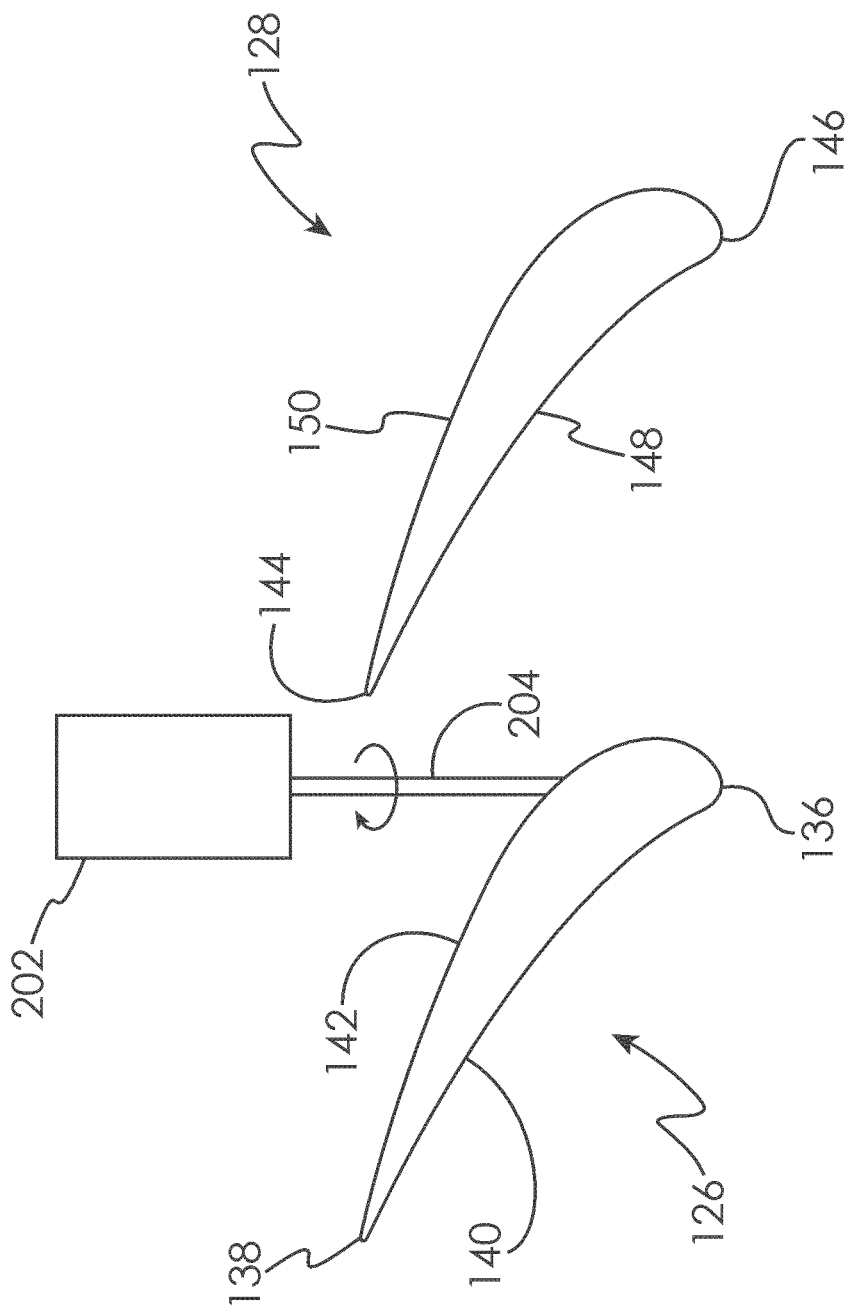
FIG. 4 is a schematic cross-sectional view of a vane cluster in an embodiment.

FIG. 4 schematically illustrates one embodiment of a system and method for applying a first, initial layer of metallic bond coat within a portion of a total surface of a vane cluster, prior to applying a second layer of metallic bond coat to substantially the total surface of the vane cluster 124. In some embodiments, the portion of the total surface area of the vane to which the initial layer of metallic bond coat is applied comprises a non-line of sight area of the vane cluster. For example, by applying a sufficient thickness of an initial layer of metallic bond coat within the area 200, the final thickness of the metallic bond coat within the area 200 after the second layer of metallic bond coat is applied to the entire vane cluster 124 will be closer to the thickness of the metallic bond coat on other, non-shadowed portions of the vane cluster 124, thereby improving the metallic bond coat coating uniformity across all surfaces of the vane cluster 124.

In one embodiment, as shown in FIG. 4, a layer of metallic bond coat is applied to a portion of the total surface area of a vane in a vane cluster using a contact metal deposition process, such as an electro-spark deposition process. The electro-spark deposition process is a micro-welding process that uses rapid electrical power discharges to accomplish metal transfer from an electrode to a contacting substrate. Electro-spark deposition has the ability to apply metallic bond coat to the desired portion of the surface area of a vane in a vane cluster with no significant heat input to the vane. In one embodiment, an electro-spark deposition device 202 is fitted with an electrode 204 formed from the metal to be used for the metallic bond coat. A first voltage is applied to the electrode 204 and a second voltage is applied to the vane 128, wherein the first voltage is greater than the second voltage. In one embodiment, the second voltage comprises ground. When the electrode 204 is applied to the surface of the vane 128, the energy transfer between the electrode 204 and the vane 128 results in material being dislodged from the tip of the electrode 204 and deposited onto the surface of the vane 128. Although the electrode 204 is shown applied to the vane 128 in the view of FIG. 4, it will be appreciated that the electrode 204 may be applied to any portion of any vane within the vane cluster. In some embodiments, the electro-spark deposition device 202 is constructed and arranged to rotate the electrode 204 during the deposition process. In other embodiments, the electro-spark deposition device 202 is constructed and arranged to supply a shielding gas to the area of contact between the electrode 204 and the surface of the vane 128.

The electrode 204 is applied to the surface of the vane 128 over the desired area until a desired thickness of metallic bond coat has been applied to the area. Afterwards, metallic bond coat can be applied to the entire vane cluster 124 by any desired process, such as low pressure plasma spray, electron beam physical vapor deposition, air spray, and electron beam directed vapor deposition, to name just a few non-limiting examples. After the second application of metallic bond coat to the vane cluster 124, the coating thickness uniformity over all of the surfaces of the vane cluster 124 is improved by the initial application of metallic bond coat to the portion of the surface area that is partially shadowed.

Therefore, the application of the initial metallic bond coat by electro-spark deposition to a portion of the surface area of the vanes provides for increased coating distribution uniformity over the surfaces between the vanes 126 and 128 within the vane cluster 124. An analogous increase in coating thickness uniformity will result for vane clusters having more than two vanes. The increase in coating thickness uniformity correspondingly increases the effectiveness of the formed coatings in providing corrosion, oxidation, and/or thermal resistance during the course of operation in a gas turbine engine. While the systems and methods disclosed herein are illustrated as applying a metallic bond coat, it will be appreciated from the present disclosure that any metallic coating may be applied using the systems and methods disclosed herein. Furthermore, although electro-spark deposition is used as an illustrative embodiment, it will be appreciated from the present disclosure that any contact metal deposition process may be used. For Example, a metal layer may be formed on a portion of the surface area of the vanes by depositing powder particulates onto the portion of the surface area of the vanes and then heating the vanes to melt and consolidate the powder particulates, to name just one additional non-limiting example.

While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed:

1. A method for application of a metallic coating to a vane cluster including at least two cluster vanes, the method comprising:
applying a first layer of metallic coating within a portion of a total surface of the at least two cluster vanes; and
applying a second layer of metallic coating to substantially the total surface of the at least two cluster vanes.

2. The method of claim 1, wherein the first and second layers of metallic coating comprise a metallic bond coat.

3. The method of claim 1, wherein the portion comprises a non-line of sight area of the total surface.

4. The method of claim 1, wherein the applying a first layer step comprises applying the first layer of metallic coating within the portion of the total surface of the at least two cluster vanes using a contact metal deposition process.

5. The method of claim 4, wherein the contact metal deposition process comprises an electro-spark deposition process.

6. The method of claim 5, wherein the electro-spark deposition process utilizes an electrode and comprises:
applying a first voltage to the electrode;
applying a second voltage to at least one of the at least two cluster vanes, wherein the first voltage is greater than the second voltage; and
touching the electrode to the portion of the total surface of the at least two cluster vanes.

7. The method of claim 6, wherein the second voltage comprises ground.

8. The method of claim 6, further comprising rotating the electrode while touching the electrode to the portion of the total surface of the at least two cluster vanes.

9. The method of claim 6, further comprising supplying a shielding gas to an area where the electrode touches portion of the total surface of the at least two cluster vanes.

10. The method of claim 6, wherein the step of touching the electrode to the portion of the total surface of the at least two cluster vanes is performed until a predetermined thickness of the first layer of metallic coating is deposited.

11. A vane cluster including at least two cluster vanes and comprising a metallic coating formed according to the method of claim 5.

12. The method of claim 1, wherein the step of applying the second layer of metallic coating is performed using a process selected from the group consisting of: low pressure plasma spray, electron beam physical vapor deposition, air spray, and electron beam directed vapor deposition.

13. A vane cluster including at least two cluster vanes and comprising a metallic coating formed according to the method of claim 12.

14. The method of claim 1, wherein the first layer is disposed beneath the second layer.

15. A vane cluster including at least two cluster vanes and comprising a metallic coating formed according to the method of claim 14.

16. A vane cluster including at least two cluster vanes and comprising a metallic coating formed according to the method of claim 1.

17. A vane cluster comprising:
a cluster platform;
a cluster shroud;
at least two cluster vanes extending between the cluster platform and the cluster shroud and defining a total surface;
a first layer of metallic coating disposed within a portion of the total surface of the at least two cluster vanes; and
a second layer of metallic coating disposed on substantially the total surface of the at least two cluster vanes.

18. The vane cluster of claim 17, wherein the metallic coating comprises a metallic bond coat.

19. The vane cluster of claim 17, wherein the first layer of metallic coating is applied within the portion of the total surface of the at least two cluster vanes using an electro-spark deposition process.

20. The vane cluster of claim 17, wherein the first layer is disposed beneath the second layer.

* * * * *